United States Patent [19]

Weatherford et al.

[11] Patent Number: 4,884,191
[45] Date of Patent: Nov. 28, 1989

[54] MEMORY ARRAY UNIT FOR COMPUTER

[75] Inventors: James R. Weatherford, Lake Dallas; Arthur T. Kimmel, Dallas, both of Tex.

[73] Assignee: Convex Computer Corporation, Richardson, Tex.

[21] Appl. No.: 328,798

[22] Filed: Mar. 24, 1989

Related U.S. Application Data

[63] Continuation of Ser. No. 18,752, Feb. 24, 1987, abandoned, which is a continuation of Ser. No. 622,457, Jun. 20, 1984, abandoned.

[51] Int. Cl.$^4$ .................... G06F 13/00; G06F 12/00; G11C 13/00
[52] U.S. Cl. .................................................. 364/200
[58] Field of Search ... 364/200 MS File, 900 MS File

[56] References Cited

U.S. PATENT DOCUMENTS

| 4,101,960 | 7/1978 | Stokes et al. | 364/200 |
| 4,172,282 | 10/1979 | Aichelmann, Jr. et al. | 364/200 |
| 4,236,207 | 11/1980 | Rado et al. | 364/200 |
| 4,400,768 | 8/1983 | Tomlinson | 364/200 |

OTHER PUBLICATIONS

Mostek, "Memory Designers Guide", Jul. 1982.

Chu, Y., Computer Organization and Micro-Programming, 1972, Chap. 7.

Primary Examiner—Gary V. Harkcom
Assistant Examiner—Christopher H. Lynt
Attorney, Agent, or Firm—Richards, Medlock & Andrews

[57] ABSTRACT

The computer (10) includes a memory control unit (12), a central processing unit (14) and a memory array unit (16). A plurality of memory array planes (36, 38, 40 and 42) are included within the memory array unit (16). A latch (82) receives write data from the memory control unit (12) through a bus (26). Address and control information is transferred from the memory control unit (12) to timing and address circuits (28, 30, 32, 34). The write data is transferred from the latch (82) into a selected one of the memory array planes (36, 38, 40, 42). For each of the memory array planes (36, 38, 40, 42) there is provided a respective read latch (60, 62, 64, 66) for receiving read data. The ouputs of the memory array planes are not connected in common. The ouputs to read latches (60, 62, 64,66) are connected in common through a bus (76) for transferring read data through the data bus (26) back to the memory control unit (12). The memory array unit (16) provides enhanced speed of operation for the computer (10) while permitting refresh interrupts to occur without loss of read or write data.

4 Claims, 1 Drawing Sheet

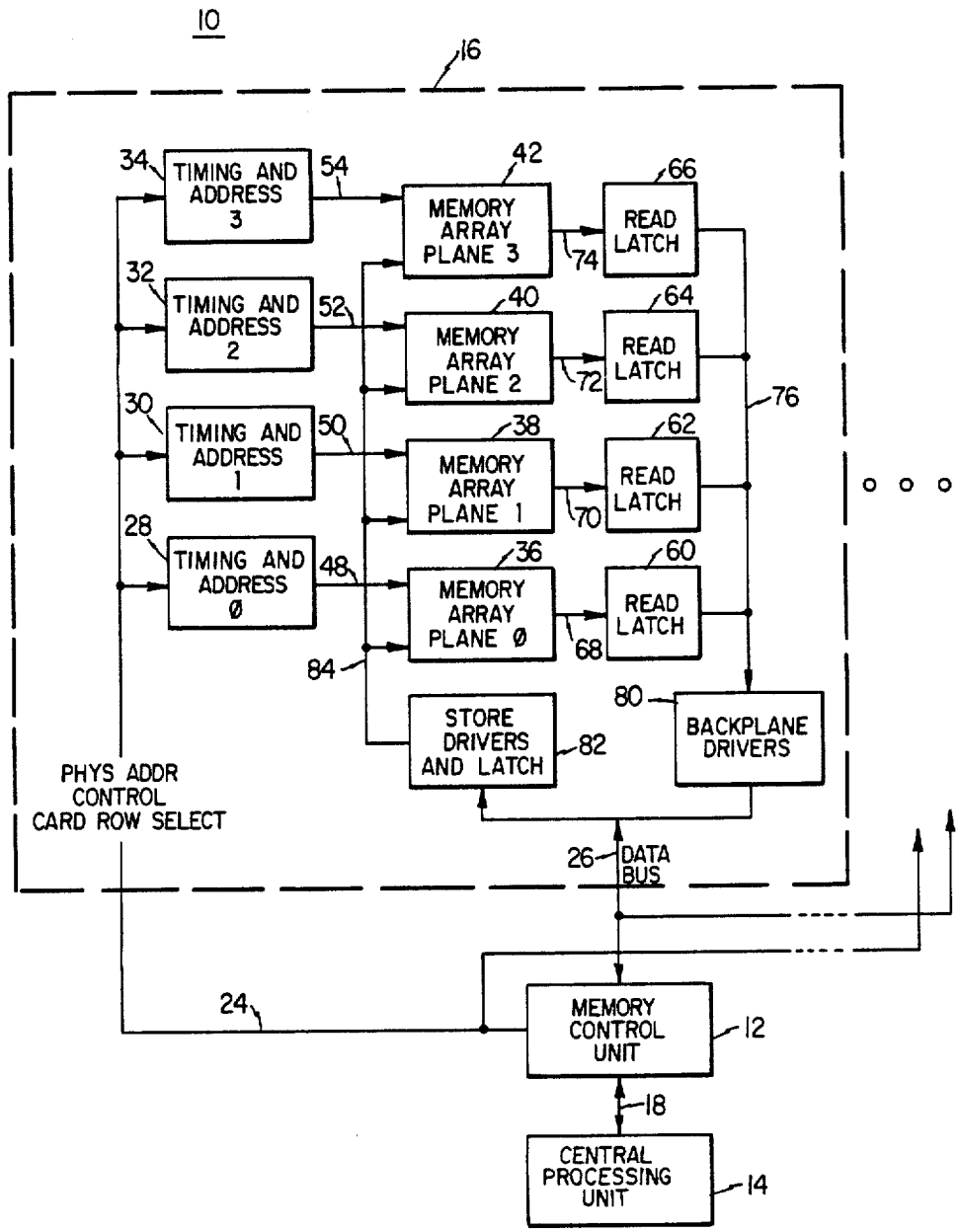

MEMORY ARRAY UNIT FOR COMPUTER

This application is a continuation, of application Ser. No. 018,752, filed Feb. 24, 1987, now abandoned, which is a continuation of Ser. No. 622,457, filed June 20, 1984, now abandoned.

TECHNICAL FIELD

The present invention pertains to computer technology and in particular to a memory unit for a computer.

BACKGROUND OF THE INVENTION

In relatively large computer systems the main memory is typically subdivided into a group of arrays or planes. This subdivision of the memory provides easier addressing and control. However, the actual transfer of data into and out of the memory planes can present several problems. In particular the tying together of numerous memory output terminals can create a substantial timing problem that significantly reduces the speed of the memory. Further, for dynamic memories, there must be periodic refreshing of the memory arrays, but this can frequently conflict with the transfer of data to and from the memory. In some refresh situations the data can actually be lost thereby requiring an additional memory cycle following the refresh.

In view of the above problems involving multiple plane memories, there exists a need for a configuration for a memory array unit in which the transfer of data to and from the memory array is not subject to timing problems and is further compatible with refresh cycles without the danger of losing data.

SUMMARY OF THE INVENTION

A selected embodiment of the present invention comprises a memory array unit for a computer which has a memory control unit for exchanging data through a bus to the memory array unit. The memory array unit includes a plurality of memory arrays each having a plurality of data storage locations. A respective address and control circuit is provided for each of the memory array units for receiving addresses and control commands from the memory control unit for controlling the corresponding memory array. A latch circuit receives a block of data from the memory control unit via the bus wherein the latch circuit is connected to transfer the data stored therein to data inputs of the memory arrays. The memory array unit further includes a respective read latch for each of the memory arrays wherein each read latch is connected to the data output of the corresponding one of the memory arrays for receiving data from the corresponding memory array. The read latches have the outputs thereof connected to the bus for sending data to the memory control unit.

BRIEF DESCRIPTION OF THE DRAWINGS

For more complete understanding of the present invention and the advantages thereof, reference is now made to the following description taken in conjunction with the accompanying drawings in which the FIGURE is a block diagram illustrating the components of a computer including a central processing unit, a memory control unit, and a memory array unit.

DETAILED DESCRIPTION OF THE INVENTION

The present invention comprises a memory array unit for use within a computer. Referring now to the FIGURE there is illustrated a computer 10 which includes a memory control unit 12, a central processing unit 14 and a memory array unit 16. Central processing unit 14 is connected through a bidirectional bus 18 to the memory control unit 12.

The memory array unit 16 receives physical address, control and card row select information through a bus 24 connected to the memory control unit 12. A bidirectional data bus 26 is connected for exchanging data between the memory array unit 16 and the memory unit 12.

The bus 24 is connected to the input of timing and address circuits 28, 30, 32 and 34. The memory array unit 16 further includes memory array planes 36, 38, 40 and 42 each of which has a plurality of data storage locations such as random access memory circuits. The outputs of the timing and address circuits 28, 30, 32 and 34 are connected through respective buses 48, 50, 52 and 54 to the inputs of the memory arrays 36, 38, 40 and 42.

The memory array unit 16 includes read latches 60, 62, 64 and 66. The memory array planes 36, 38, 40 and 42 are connected through respective data transfer buses 68, 70, 72 and 74 to read latches 60, 62, 64 and 66.

The outputs of the read latches 60, 62 64 and 66 are connected in common to an output bus 76 which is further connected to backplane drivers 80. The drivers 80 are connected to supply data to the data bus 26.

A store drivers and latch 82 is connected to receive blocks of data from the data bus 26 and shift the stored data through a bus 84 to the data inputs of memory array planes 36, 38, 40 and 42.

Although only one memory array unit 16 is shown in the FIGURE there may be numerous additional similar array units connected to the extensions of the buses 24 and 26. In a typical application there may be from one to eight of the memory array units 16 in the computer 10.

Operation of the memory array unit is now described in reference to the FIGURE. The memory control unit 12 both writes data into the memory array unit 16 and reads data from the memory array unit 16. In either case the memory control unit 12 must transmit address and control information to the memory array unit 16. Address decoders (not shown) within memory control unit 24 transmit control signals to circuits 28, 30, 32, and 34 so as to permit selected addresses to be recognized by the corresponding memory array planes. The control information transmitted via bus 24 essentially determines whether the operation is a read or a write. Card row select is a form of addressing which directs the address to the appropriate one of the two sets of random access memory rows contained within each plane within the memory array unit 16.

In a write operation the memory control unit 12 transfers data through the bus 26 where it is stored in the latch 82. The latch 82 is preferably a 74F374 driver of the type manufactured by Fairchild, Inc. The latch 82 is capable of providing sufficient current to the bus 84 such that the capacitance of the bus does not substantially slow the operation of the memory.

The operation of the timing and address circuits 28, 30, 32 and 34 serves to recognize a particular address and activate the corresponding memory array plane to receive the data from the latch 82. The remaining memory array planes are not activated. The data from the latch 82 is then transferred through the data input into the appropriate memory array plane where it is then stored.

In a read operation the selected address and control information is also transmitted through bus 24 to the timing and address circuits 28, 30, 32 and 34 where the address is decoded as in a write operation. However, the control command causes the selected memory array plane to read the desired address. The selected one of the memory array planes 36, 38, 40, 42 produces the requested block of data and transfers it into the corresponding read latches 60, 62, 64 or 66. Note that the data outputs of the memory array planes 36, 38, 40 and 42 are not connected in common. If these outputs were connected in common the minimum CAS (column address strobe) strobe timing width and the memory device turn-on/turn-off times with respect to the CAS timing signal would not permit maximum rate pipelined read operations. However, in the present invention the outputs of the memory array planes are directed to separate read latches which are preferably a model 74F373 manufactured by Fairchild, Inc. The isolation of the outputs permits the random access memory rows in the unit 16 to be cycled every clock cycle, such as 100 NS, and their outputs can be pipelined for read operations.

After data has been transferred into the appropriate read latch, it is then transmitted through the bus 76 to the backplane drivers 80 which further provides the data through the data bus 26 to the memory control unit 12. This completes the read operation.

The memory array planes are typically made up of a large number of dynamic random access memory circuits. Dynamic memory circuits must be periodically refreshed at a period of approximately two milliseconds. The refresh operations must be carried out at periodic intervals to maintain the data stored in the memory array planes 36, 38, 40 and 42. However, it has been a conventional practice that a refresh interrupt may occur after a read or write operation has already been initiated by the memory control unit 12. When this occurs, it has been a problem that the data being written into the memory or the data which has been immediately read from the memory may be lost due to the refresh operation. If this happens, the memory cycle must be repeated to complete the desired operation. This can increase the latency time in the use of the main memory. With the present invention the data being written into the main memory is stored in the latch 82 such that when a refresh occurs the data in the latch 82 is first written into dynamic random access memory circuits in the memory array planes, deferring the refresh until the write operations is complete. In a similar fashion the data read from the memory is immediately transferred into the latches 60, 62, 64 or 66. Should an interrupt occur before the data is transferred from the latches back to the memory control unit 12, the data is held in the read latches until the refresh operation is complete. There is thus no loss of read data when an interrupt for refresh occurs. After the refresh is complete, data is then transferred from the read latches through the back plane drivers 80 to the memory control unit 12.

In summary, the present invention comprises a memory array unit which has an increased speed of operation for a main memory which has a plurality of memory array planes and further includes the capability of preventing any loss of write or read data due to a refresh interrupt.

Although one embodiment of the invention has been illustrated in the accompanying drawings and described in the forgoing detailed description, it will be understood that the invention is not limited to the embodiment disclosed, but is capable of numerous rearrangements, modifications and substitutions of parts and elements without departing from the scope of the invention.

We claim:

1. A memory array unit for use in a computer which has a central processing unit that operates in conjunction with a memory control unit, comprising:

a plurality of memory array planes each including a plurality of integrated circuit memory devices for storing data therein, each said memory array plane having an input for receiving data for storage in said memory devices and an output for supplying data read from said memory devices, a respective address and control circuit for each of said memory array planes, each address and control circuit connected to receive address information and control commands from said memory control unit and connected to provide address information and control commands to the corresponding one of said memory array planes, a store latch having an input and an output, a bidirectional data bus connected between said memory control unit and the input of said store latch, wherein said store latch only receives data from said memory control unit, a unidirectional input bus connected between the output of said store latch and the inputs of said memory array planes, wherein said unidirectional input bus transfers data only from said store latch to the inputs of said memory array planes, a respective read latch for each of said memory array planes, each read latch having an input and an output, the input for each read latch connected to the output of the corresponding one of said memory array planes, a driver circuit having an input and an output, the output of said driver circuit connected to said bidirectional bus for transferring data only from said driver circuit to said memory control unit, and a unidirectional output bus connected between the outputs of said read latches and the input of said driver circuit for transferring data only from said read latches to said driver circuit.

2. A memory array unit as recited in claim 1 wherein there are four of said memory array planes in said memory array unit, four of said address and control circuits and four of said read latches.

3. A method for optimizing the utilization of a bidirectional memory bus connected between a memory control unit and a memory array plane of a computer, comprising the steps of:

transferring data bidirectionally through a data bus connected to said memory control unit, each data unit conveyed through said data bus during one clock cycle, transmitting respective read commands and corresponding addresses from said memory control unit to a plurality of memory array planes in said memory array unit wherein said memory array planes can have at least partially concurrent read cycles, producing output data from said memory array planes in response to said read commands and corresponding addresses and storing said output data in respective read latches corresponding to each of said memory array planes, and transferring said output data through a unidirectional output bus to a common driver circuit, which driver circuit has the output thereof connected to said bidirectional data bus, as soon as clock cycles become available for using said bidirectional bus, wherein said read latches serve to buffer the output data produced by said memory array planes before the output data is transmitted through said bidirectional bus to said memory control unit.

4. The method recited in claim 3 including the step of providing write data, to be stored in a one of said memory array planes, to a store latch having the output thereof connected to the inputs of said memory array planes, said write data stored in said store latch concurrently with read data, read from said one memory array plane, stored in the read latch for said one memory array plane.